United States Patent
Stebbins et al.

(10) Patent No.: US 10,399,380 B2
(45) Date of Patent: Sep. 3, 2019

(54) METHOD OF COATING A CAST ALLOY WHEEL PROVIDING A TWO-TONE APPEARANCE

(71) Applicant: Superior Industries International, Inc., Southfield, MI (US)

(72) Inventors: Don Stebbins, Bloomfield Hills, MI (US); Thomas Schwing, Southfield, MI (US)

(73) Assignee: Superior Industries International, Inc., Southfield, MI (US)

( * ) Notice: Subject to any disclaimer, the term of this patent is extended or adjusted under 35 U.S.C. 154(b) by 0 days.

(21) Appl. No.: 15/349,761

(22) Filed: Nov. 11, 2016

(65) Prior Publication Data

US 2017/0129279 A1 May 11, 2017

Related U.S. Application Data

(60) Provisional application No. 62/253,923, filed on Nov. 11, 2015.

(51) Int. Cl.
*B60B 3/02* (2006.01)
*B60B 3/06* (2006.01)
(Continued)

(52) U.S. Cl.
CPC .................. *B60B 3/02* (2013.01); *B60B 3/06* (2013.01); *B60B 3/10* (2013.01); *C23C 14/024* (2013.01);
(Continued)

(58) Field of Classification Search
CPC .... B60B 3/02; B60B 3/06; B60B 3/10; B60B 19/00; B60B 2310/621; B60B 2310/652;
(Continued)

(56) References Cited

U.S. PATENT DOCUMENTS 4,770,946 A * 9/1988 Yamauchi ............... C23C 14/20
205/199
5,632,529 A 5/1997 Wei
(Continued)

FOREIGN PATENT DOCUMENTS

DE 102005048870 A1 * 4/2007 ............. B32B 27/16
EP 0351114 A2 * 1/1990 ............... B60B 3/06
JP 2007099151 A 4/2007

OTHER PUBLICATIONS

Third Party Observation for related WO Application No. PCT/US2016/061643, dated Nov. 29, 2017.

*Primary Examiner* — Kip T Kotter
(74) *Attorney, Agent, or Firm* — Miller Canfield

(57) ABSTRACT

A cast wheel having an alloy substrate includes a primary surface and a secondary surface. A first polymeric coating is applied to the primary surface and to the secondary surface sealing the cast alloy wheel within the first polymeric coating. An intermediate polymeric coating is applied over the first polymeric coating. The intermediate polymeric coating is coated with metal using physical vapor deposition with the metal being aesthetically distinguishable from the first polymeric coating. A third polymeric coating is applied over the metal. The third polymeric coating, the intermediate coating and the metal from the primary surface of the cast alloy wheel are removed aesthetically distinguishing the primary surface from the secondary surface. A fourth polymeric coating is applied over the primary surface and the secondary surface.

11 Claims, 2 Drawing Sheets

(51) Int. Cl.
*B60B 3/10* (2006.01)
*C23C 14/02* (2006.01)
*C23C 14/16* (2006.01)
*C23C 14/24* (2006.01)
*C23C 14/58* (2006.01)
*C23C 28/00* (2006.01)
*C25D 13/06* (2006.01)
*C25D 13/12* (2006.01)

(52) U.S. Cl.
CPC .............. *C23C 14/16* (2013.01); *C23C 14/24* (2013.01); *C23C 14/58* (2013.01); *C23C 14/588* (2013.01); *C23C 28/00* (2013.01); *C25D 13/06* (2013.01); *C25D 13/12* (2013.01); *B60B 2310/621* (2013.01); *B60B 2310/652* (2013.01); *B60B 2310/656* (2013.01); *B60B 2360/10* (2013.01); *B60B 2360/30* (2013.01); *B60B 2900/212* (2013.01); *B60B 2900/572* (2013.01)

(58) Field of Classification Search
CPC . B60B 2310/656; C23C 14/588; C23C 28/00; C23C 14/024; C23C 14/16; C23C 14/58; C23C 14/24; C25D 13/12; C25D 13/06
See application file for complete search history.

(56) References Cited

U.S. PATENT DOCUMENTS

| | | | |
|---|---|---|---|
| 6,068,890 A | 5/2000 | Kaumle et al. | |
| 9,259,963 B2* | 2/2016 | Uemura | B05D 7/53 |
| 2002/0102416 A1 | 8/2002 | Mayzel | |
| 2005/0175785 A1* | 8/2005 | Hentsch | C23C 28/00 427/402 |
| 2011/0045306 A1* | 2/2011 | Johnson | B29C 43/28 428/423.1 |
| 2012/0015209 A1* | 1/2012 | Straccia | C23C 28/00 428/632 |
| 2012/0019047 A1 | 1/2012 | Niedermayer | |
| 2014/0017488 A1 | 1/2014 | Haack et al. | |
| 2015/0225839 A1* | 8/2015 | Visker | C23C 14/165 428/654 |
| 2015/0284835 A1* | 10/2015 | Ge | B05D 7/16 428/215 |
| 2015/0284836 A1* | 10/2015 | Liu | C25D 11/005 428/64.1 |
| 2015/0353773 A1* | 12/2015 | Dornseif | C23C 14/58 428/35.9 |
| 2017/0320080 A1* | 11/2017 | Kakar | B05B 7/00 |

* cited by examiner

METHOD OF COATING A CAST ALLOY WHEEL PROVIDING A TWO-TONE APPEARANCE

PRIOR APPLICATIONS

The present application claims priority to U.S. Provisional Patent Application No. 62/253,923 filed Nov. 11, 2015, the contents of which are incorporated herein by reference.

TECHNICAL FIELD

The present application relates generally toward a process for coating cast alloy wheels. More specifically, the present application relates toward a method of coating a cast alloy wheel to achieve a unique metallic, two-tone color appearance.

BACKGROUND

Cast alloy wheels have been increasing in market share for many years. Cast alloys provide both weight reduction and unique appearance not available to old style steel wheels decorated with hubcaps. Various methods for providing a durable and aesthetically pleasing coating to cast alloy wheels have varied widely. Early versions of cast alloy wheels were coated with lacquer paint, which provided aesthetically pleasing qualities, but did not provide necessary durability. Later generations of cast alloy wheels were coated with multi-layer paint systems that included primers, colorization or base coats, and a clear coat to provide a high level of gloss to the alloy wheel. In some instances, the paint coatings are removed so that the substrate of the cast alloy is exposed to achieve a unique, "bright metallic surface" over which a clear coat is applied.

Later generations of cast alloy wheels have been provided with a metallic finish without requiring significant machining to provide a metallic aesthetic by exposing the cast alloy substrate. One such example is the use of physical vapor deposition (PVD) used to apply various alloys and metals such as, for example, aluminum, chromium, titanium, silver, nickel, and even gold over one or more layers of paint or primer that are applied to the substrate to provide a sufficiently smooth surface to receive the PVD metal coat. PVD processes have been used to coat wheels and are disclosed in U.S. Pat. No. 5,656,335, the contents of which are enclosed herein by reference.

However, consumers of vehicles having cast alloy wheels demand ever-improving and unique aesthetic qualities, such as, for example, two-tone or even multi-tone appearance providing various colors to the visible surface of the cast alloy wheel. Therefore, it would be desirable to provide a two-tone appearance to a cast alloy wheel while still making use of the desirable qualities provided by PVD coatings not presently available.

SUMMARY

A cast alloy wheel includes a primary surface and a secondary surface. The first polymeric coating is applied to the primary surface and to the secondary surface to seal the cast alloy wheel. An intermediate polymeric coating is applied over the first polymeric coating. The intermediate polymeric coating is subsequently coated with a metal using a physical vapor deposition process where the metal is aesthetically distinguishable from the first polymeric coating. A third polymeric coating is applied over the metal. The third polymeric coating, the intermediate polymeric coating, and the metal are removed from the primary cast alloy wheel exposing the first polymeric coating to aesthetically distinguish the primary surface from the secondary surface. A fourth polymeric coating is applied over the primary surface and the secondary surface.

Inventive coating method of the present application provides a smooth metallic appearance along with a two-tone quality without having to machine a bright surface of a wheel. The metallic alloy provides an appreciable metallic appearance to the wheel with a two-tone quality after removal of a portion of the metallic coating from the primary surface of the wheel. Therefore, enhanced aesthetic qualities not previously available on cast alloy wheels are now achievable providing that unique two-tone appearance taking advantage of the best features of the PVD applied metal and a polymeric coating.

BRIEF DESCRIPTION OF THE DRAWINGS

Other advantages of the present invention will be readily appreciated as the same becomes better understood by reference to the following detailed description, when considered in connection with the accompanying drawings, wherein.

DETAILED DESCRIPTION

Figure 1:
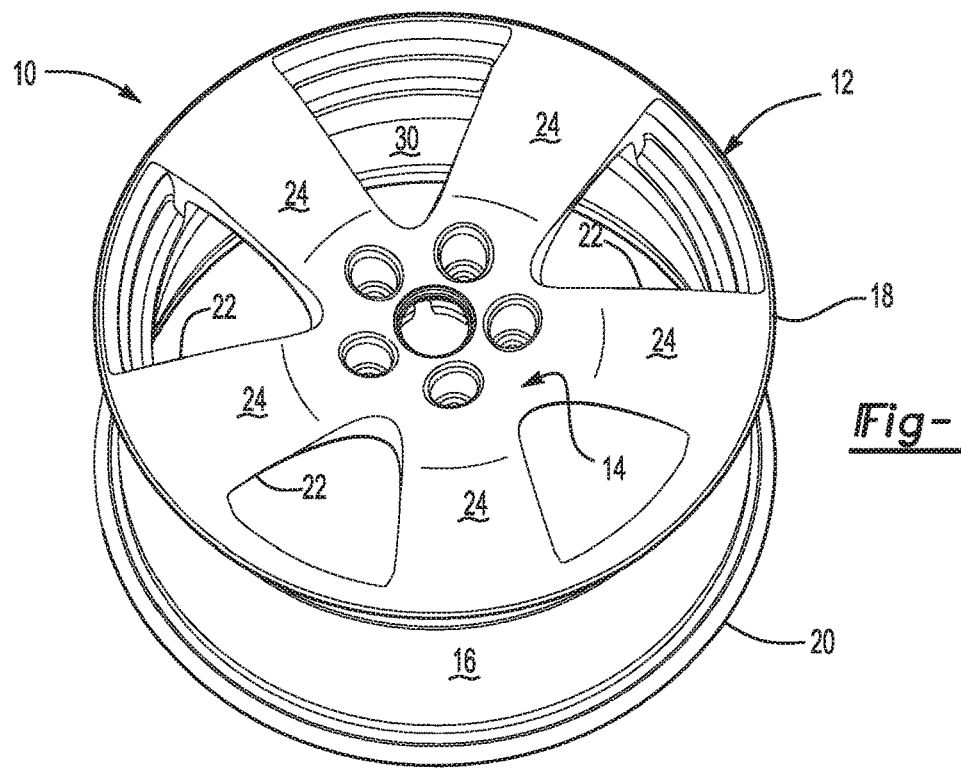
FIG. 1 shows a perspective view of a cast alloy wheel.
Figure 2:
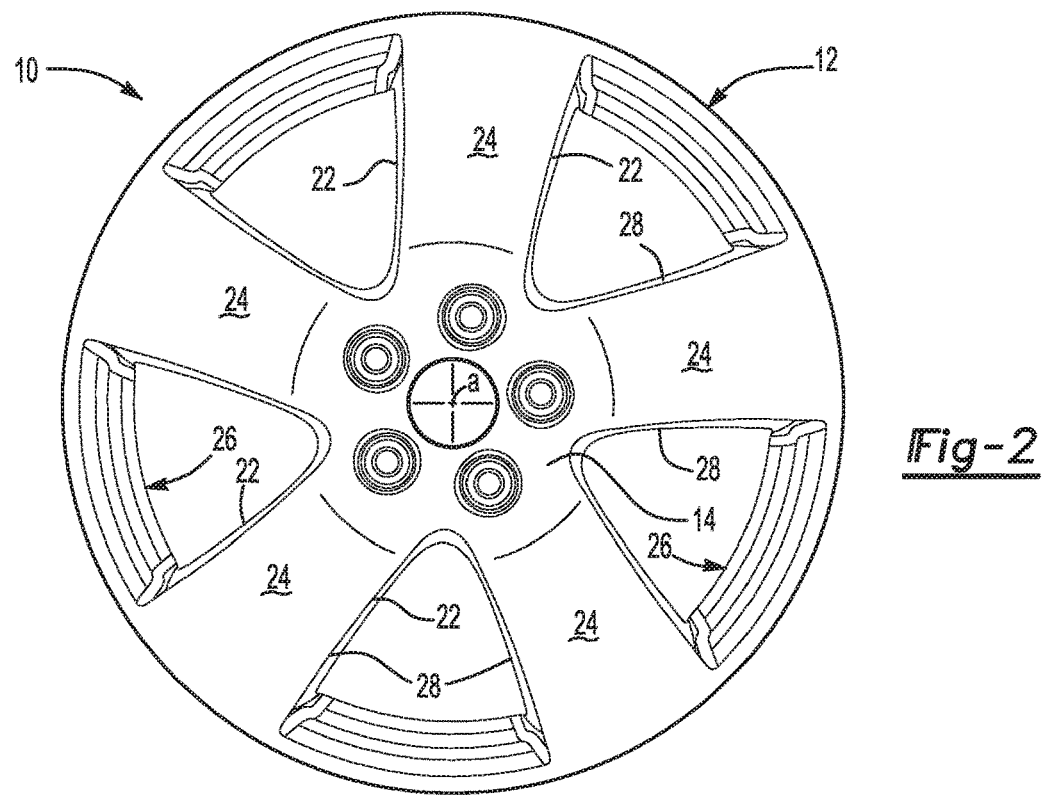
FIG. 2 shows a front view of a cast alloy wheel.

Referring to FIG. 1, a cast alloy wheel of the present invention is generally shown at 10. The wheel 10 is cast from an aluminum alloy, a magnesium alloy, a titanium alloy, or an equivalent alloy as is known to those of skill in the art. The wheel 10 includes a rim element 12 that defines an axis a (FIG. 2). A central element 14 extends radially outwardly between the axis a and the rim element 12. The rim element 12 defines a drop surface (or annular wall) 16 extending between a distal bead 18 and a proximal bead 20 at a location that is disposed radially inwardly from the two beads, 18, 20. It should be understood by those of ordinary skill in the art that the proximal bead 18 is located outboard of a motor vehicle (not shown) and the distal bead 20 is located inboard of the motor vehicle. Furthermore, the drop surface 16 is defined as a cylindrical surface circumscribing the axis a in a known manner.

Referring now to FIG. 2, the central element 14 includes a plurality of spokes 22. Each spoke 22 includes a face or primary surface 24. A secondary surface 26 extends axially toward the distal bead rearward from the primary surface 24. It should be understood that the secondary surface 26 includes all surfaces extending axially in the direction of the distal bead 18 that are visibly apparent. This includes opposing sidewalls 28 of the spokes 22 and inner annular wall surface 30. It should be understood by those of ordinary skill in the art that the configuration of the spokes 22 and of the central element 14 is merely exemplary and that a wide variety of spoke and central element configurations are included within the scope of this invention. Further, the primary surface 24 also includes the central element 14 in some embodiments.

Figure 3:
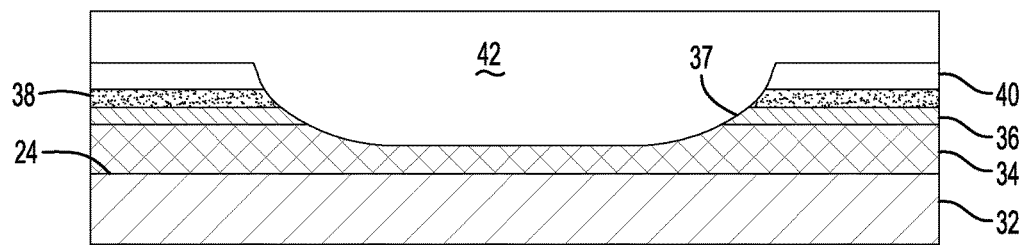
FIG. 3 shows a cross-sectional view of a cast alloy wheel having been subject to the method of coating of the present application.

Referring now to FIG. 3, a cross-sectional view of a portion of the primary surface 24 is shown. A cast alloy 32 defining the primary surface 24 as an unfinished surface that includes an undesirable surface roughness not known to provide aesthetically pleasing qualities without additional processing. Therefore, in one embodiment the primary surface 24 is pre-machined to reduce the surface roughness. However, it is also within the scope of this invention that the primary surface 24 is not pre-machined in alternative embodiments. After forming and pre-machining, the wheel 10 is subject to cleaning and pretreatment in a known manner. A first polymeric coating or primer 34 is applied to the cast alloy 32 in a known manner. The first polymeric coating 34 optionally includes one of a powder coating, an autophoretic coating, an electrodeposition coating, or any other coating known to provide environmental durability against defects such as, for example, corrosion or stone chipping. In addition, the first polymeric coating 34 is pigmented to provide a desirable color, the purpose of which will be explained further herein below. A film thickness of the first polymeric coating 34 is contemplated to be between 355 microns and 381 microns. However, if the primary surface 24 is not machined, it is believed the film thickness would be increased.

An intermediate polymeric coating 36 is applied over the first polymeric coating 34. The intermediate polymeric coating 36 is contemplated to be applied by way of a spray system, being either powder or liquid. The intermediate polymeric coating 36 is smoother than the first polymeric coating 34 and provides a high gloss appearance. In addition, the intermediate polymeric coating 36 includes a film thickness between about 100 microns and 150 microns. In one embodiment, the intermediate polymeric coating 36 is not pigmented to provide any visible coloration, but is clear or substantially transparent. In an alternative embodiment, the intermediate polymeric coating 36 is pigmented to achieve an identical or similar color as the first polymeric coating 34, or, in the alternative, a distinguishing color from the first polymeric coating 34, the purpose of which will become more evident herein below.

A metallic layer 38 is applied over the intermediate polymeric coating 36 using a PVD process to achieve a reflective or mirrored metallic appearance or finish. As such, various metals including, but not limited to, chromium, nickel, aluminum, silver, gold and even alloys are applied by the PVD process set forth in U.S. Pat. No. 5,656,335, or an equivalent process, the contents of which are included herein by reference, and will not be further discussed. The high gloss intermediate polymeric coating 36 enhances the mirrored appearance of the metallic layer 38. The PVD process encapsulates the wheel 10, and the first polymeric coating with the metal. As used herein, encapsulates and encapsulating includes substantial encapsulation where some gaps may exists as part of process variability and further includes encapsulating primary and secondary surfaces 24, 26 of the vehicle wheel 10. Having achieved a desirable roughness value of the intermediate polymeric coating 36, the metallic layer 38 can provide a bright, shiny finish achieving a desirable and aesthetically pleasing gloss representative of a machined or polished substrate. In one embodiment, the metallic layer 38 includes a film thickness of between 0.1 microns and 0.3 microns. The metal forming the metallic layer 38 forms a physical and molecular bond to the intermediate polymer coating 36 providing desirable adhesion desirable for further processing.

A third polymeric coating 40 is applied over the metallic layer 38. In one embodiment, the third polymeric coating 40 is a clear coating providing no pigmentation. The coating is contemplated to be a urethane, acrylic, polyester, or any other polymer coating capable of achieving desired performance characteristics. When not pigmented, the third polymeric coating 40 provides additional gloss to the metallic layer 38. In an alternative embodiment, the third polymeric coating 40 is lightly pigmented to provide alternate color appearance to the metallic layer 38, which is contemplated to include opalescent pigments and other light reflective properties.

After the third polymeric coating has been applied, the wheel 10 is placed in a precision lathe, or equivalent machine and at the primary surface 24 a predetermined portion of the intermediate polymeric coating 36, the metallic layer 38, and the third polymeric coating 40 is removed exposing the first polymeric coating 34. It is contemplated that the same lathe may be used to remove the various layers 36, 38, and 40 from the primary surface as performs the pre-machining. In one embodiment, between about 125 microns and 180 microns of the first polymeric coating 34 are removed. Therefore, a two-tone appearance is achieved when the first polymeric coating 34 is pigmented in a manner to distinguish the first polymeric coating 34 from the metallic layer 34. Pre-machining the primary surface 24 is believed to reduce fallout where the wheel substrate 32 might be exposed due to undesirable surface roughness when removing 125 microns to 180 microns of the first polymeric coating 34.

In another embodiment, the intermediate polymeric coating 36 is not visible either by a contour machined at the primary surface 24, or because the pigmentation, or lack of pigmentation makes the intermediate polymeric coating 36 indistinguishable from the first polymeric coating 34. Alternatively, the intermediate polymeric coating 36 is distinguishable from the first polymeric coating 34 providing a bead 37 or appearance of a bead 37 circumscribing the predetermined portion of the primary surface 24.

Once the desirable two-tone effect has been achieved, a final clear polymeric coating 42 is applied over, at least the primary surface 24 of the wheel 10. Alternatively, the primary surface 42 and the secondary surface 26 of the wheel 10 are coated with the clear polymeric coating 42 to achieve a consistent gloss level throughout the visible spectrum of the wheel 10. However, prior to applying the final clear polymeric coating 42, the wheel is subjected to cleaning and further pretreatment to prevent dirt and contamination from being entrapped in the final clear polymeric coating 42. It should be understood by those of ordinary skill in the art that the combination of paint and metallic layers, after the application of the clear polymeric coating 42 includes a substantially common film thickness at the primary surface 24 of the wheel 10. However, it is further contemplated that the combined film thickness at the secondary surface 26 of the wheel 10 is somewhat less than that of the primary surface 24 of the wheel 10. It should be further understood that the intermediate polymeric coating 36 is optional and may not be applied. In this embodiment, the first polymeric coating 34 may include an additional thickness to achieve the desired combined film thickness.

Figure 4:
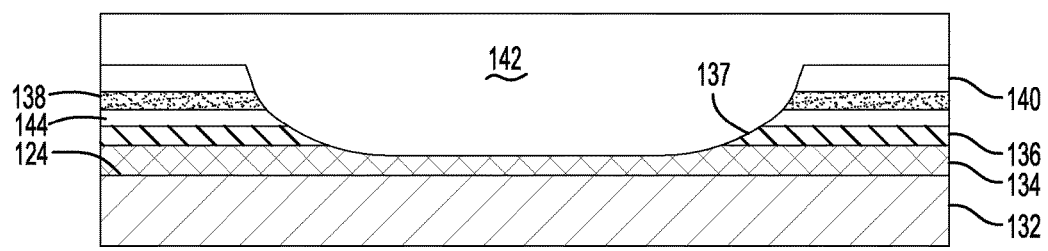
FIG. 4 shows a cross-sectional view of an alternative embodiment of the cast alloy wheel subject to the method of coating of the present invention.

An alternative embodiment is shown in FIG. 4 wherein like elements include like element numbers as that of the embodiment disclosed in FIG. 3, but in the 100 series. In this embodiment, a second intermediate polymeric coating 144 is applied between the intermediate polymeric coating 136 and the metallic layer 138. Like in the first embodiment, the wheel 10 is placed in a mill and a predetermined portion of the third polymeric coating 140, the metallic layer 138, the second intermediate polymeric coating 144, the intermediate polymeric coating 136 are removed exposing the first polymeric coating 134. In this embodiment, the second intermediate polymeric coating 144 includes a different pigmentation than that of the first polymeric coating 136 providing further distinguishing beads 137 or circumscribing coloration at the primary surface 124. In this manner, the second intermediate polymeric coating 144 may be pigmented to match various features or coloration on a motor vehicle (not shown) on which the wheel 10 is mounted.

Figure 5:
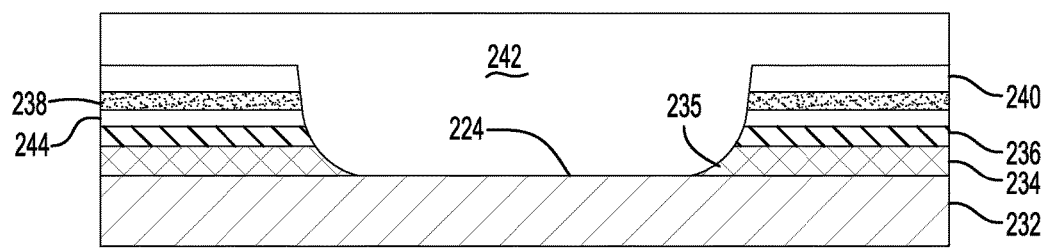
FIG. 5 shows a cross-sectional view of a still further alternative embodiment of the cast alloy wheel subject to the method of coating of the present invention.

A further embodiment is shown in FIG. 5 where like elements include like element numbers as the prior embodiments, but in the 200 series. In this embodiment, the milling operation removes an entire predetermined portion of the first polymeric coating 234 exposing the cast alloy substrate 232. Further, the milling operation is capable of adding a design feature by changing the contour of the cast alloy substrate 232. Therefore, the clear polymeric coating 242 coats the cast alloy substrate 232 or the wheel 10. As such, machine operation achieves a desired surface roughness of a cast alloy substrate 232 to achieve a "bright" surface further distinguished from the metallic layer 238. In this manner, two different aesthetically distinguished metallic areas are disposed upon the primary surface 224 of the wheel 10 achieving a unique appearance not previously thought obtainable without significantly difficult processing. In addition, pigmentation of the optional intermediate polymeric layer 236, the second intermediate polymeric layer 244 can achieve additional distinguishing characteristics as set forth above, such as, for example a circumscribing bead 235.

Ultraviolet absorbers may also be included in any of the paint layers to prevent degradation of the paint, and even discoloration of the metallic layer 38. As set forth above, different pigmentation may also be included in either one of or both the third polymeric coating 40 or the fourth polymeric coating 42. In addition, multiple metallic affects may be achieved by exposing the cast alloy substrate of the primary surface 24 to be contrasted by a complimentary or distinguishable metal 38 applied by PVD process.

Obviously, many modifications and variations of the present invention are possible in light of the above teachings. The foregoing invention has been described in accordance with relevant legal standards; thus, the description is merely exemplary rather than limiting in nature. Variations and modifications to the disclosed embodiment have become apparent to those skilled in the art and do come within the scope of this invention. Accordingly, the scope of the legal protection afforded this invention can only be determined by studying the following claims.

What is claimed is:

1. A vehicle wheel, comprising:
    a cast alloy substrate comprising a first metal and defining a primary surface and a secondary surface;
    a first polymeric coating applied to said cast alloy substrate;
    a second metal defining an encapsulating layer deposited over said first polymeric coating; and
    said encapsulating layer of said second metal defining an opening on said primary surface thereby exposing a portion of said first polymeric coating, with said first polymeric coating being pigmented for concealing said first metal at said opening in said second metal thereby providing an aesthetically distinguishable appearance from said second metal for presenting a two-tone appearance on said primary surface of said wheel.

2. The vehicle wheel set forth in claim 1, wherein said first polymeric coating includes a first film thickness disposed beneath said second metal and a second film thickness disposed at said opening in said encapsulating layer, with said second film thickness being less than said first film thickness.

3. The vehicle wheel set forth in claim 1, wherein said first polymeric coating includes a first polymeric coating opening disposed at said opening in said encapsulating layer thereby exposing said first metal.

4. The vehicle wheel set forth in claim 3, wherein said first metal is aesthetically distinguishable from said second metal.

5. The vehicle wheel set forth in claim 1, further including an intermediate polymeric layer disposed between said second metal and said first polymeric coating.

6. The vehicle wheel set forth in claim 5, wherein said intermediate polymeric layer includes an intermediate polymeric opening disposed at said opening in said second metal at said primary surface.

7. The vehicle wheel set forth in claim 1, further including a second polymeric material overlaying said second metal.

8. The vehicle wheel set forth in claim 7, further including a clear polymeric material overlaying the second polymeric material.

9. The vehicle wheel set forth in claim 8, wherein said second polymeric material includes a second polymeric material opening disposed at said opening of said second metal exposing a bead of said second polymeric material circumscribing exposed said first metal below said second metal.

10. The vehicle wheel set forth in claim 1, wherein said encapsulating layer of said second metal partially encapsulates said vehicle wheel.

11. The vehicle wheel set forth in claim 1, wherein exposed of said first polymeric material is circumscribed by a bead of an intermediate polymeric material.

* * * * *